United States Patent
Hasegawa et al.

(10) Patent No.: US 9,876,022 B1
(45) Date of Patent: Jan. 23, 2018

(54) METHOD FOR MANUFACTURING SEMICONDUCTOR DEVICE

(71) Applicant: TOSHIBA MEMORY CORPORATION, Minato-ku, Tokyo (JP)

(72) Inventors: Tomo Hasegawa, Yokkaichi Mie (JP); Kazuhisa Matsuda, Yokkaichi Mie (JP); Toshiyuki Sasaki, Yokkaichi Mie (JP); Mitsuhiro Omura, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/449,689

(22) Filed: Mar. 3, 2017

(30) Foreign Application Priority Data

Sep. 23, 2016 (JP) .................................. 2016-185376

(51) Int. Cl.
| | | |
|---|---|---|
| *H01L 21/311* | (2006.01) | |
| *H01L 27/11568* | (2017.01) | |
| *H01L 21/3065* | (2006.01) | |
| *H01L 21/027* | (2006.01) | |
| *H01L 21/28* | (2006.01) | |

(52) U.S. Cl.
CPC .... *H01L 27/11568* (2013.01); *H01L 21/0273* (2013.01); *H01L 21/28282* (2013.01); *H01L 21/3065* (2013.01)

(58) Field of Classification Search
CPC ........... H01L 21/3065; H01L 21/30655; H01L 21/0273; H01L 21/28282; H01L 21/32136; H01L 21/31116; H01L 27/11568; H01L 21/02639
USPC ........................................ 438/702, 712, 714
See application file for complete search history.

(56) References Cited

U.S. PATENT DOCUMENTS

| | | |
|---|---|---|
| 6,140,225 A | 10/2000 | Usami et al. |
| 6,451,620 B2 | 9/2002 | Nakagawa et al. |
| 6,638,848 B1 | 10/2003 | Fukasawa et al. |
| 2001/0030169 A1 | 10/2001 | Kitagawa et al. |
| 2002/0132446 A1* | 9/2002 | Komori ............ H01L 21/76213 438/449 |
| 2007/0298604 A1* | 12/2007 | Liu .................... H01L 21/31144 438/624 |

FOREIGN PATENT DOCUMENTS

| | | |
|---|---|---|
| JP | H05-182938 | 7/1993 |
| JP | 2000-340549 A | 12/2000 |

* cited by examiner

*Primary Examiner* — Brook Kebede
(74) *Attorney, Agent, or Firm* — Foley & Lardner LLP

(57) ABSTRACT

A method for manufacturing a semiconductor device includes forming a resist film on a film to be processed. An upper portion of the film to be processed is processed using the resist film as a first mask. Tungsten or a tungsten compound is selectively formed on the resist film. A lower portion of the film to be processed is processed with a reducing gas using the tungsten or the tungsten compound as a second mask.

12 Claims, 5 Drawing Sheets

METHOD FOR MANUFACTURING SEMICONDUCTOR DEVICE

CROSS-REFERENCE TO RELATED APPLICATION

This application claims the benefit of and priority to Japanese Patent Application No. 2016-185376, filed Sep. 23, 2016, the entire contents of which are incorporated herein by reference.

FIELD

Embodiments described herein relate generally to a method for manufacturing a semiconductor device.

BACKGROUND

In recent years, a three-dimensional memory in which memory cells are three-dimensionally arranged has been developed. In the three-dimensional memory, in order to increase the storage capacity thereof, the number of memory cells stacked in layers is increasing, and the diameter of a memory hole is becoming smaller. Accordingly, the aspect ratio of a memory hole has become very high. A mask material used for forming memory holes with such a high aspect ratio is highly resistant to etching and is very thick in film thickness. When such a mask material is processed by using an oxide mask, ions in the etching gas may collide with the oxide mask for a long period of time. This may gradually deform the oxide mask and then block a pattern of memory holes.

DETAILED DESCRIPTION

Figure 1:
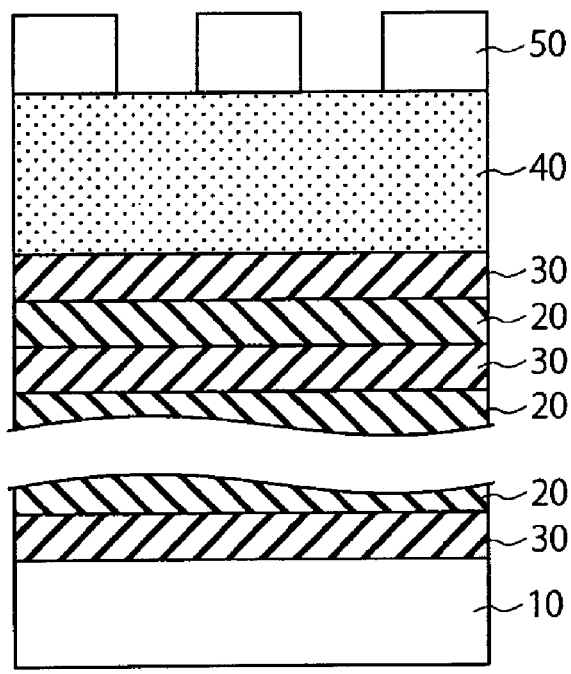
FIG. 1 is a cross-sectional view illustrating a method for manufacturing a semiconductor device according to some embodiments.

An example embodiment provides a method for manufacturing a semiconductor device capable of preventing block of an etching pattern.

According to some embodiments, a method for manufacturing a semiconductor device may include forming a resist film above a film to be processed. In some embodiments, an upper portion of the film to be processed may be processed using the resist film as a first mask. In some embodiments, tungsten or a tungsten compound may be selectively formed on the resist film. In some embodiments, a lower portion of the film to be processed may be processed with a reducing gas using the tungsten or the tungsten compound as a second mask.

Hereinafter, example embodiments of the present disclosure will be described with reference to the drawings. The embodiments in no way limit the present disclosure. In some embodiments, the upper and lower directions of a semiconductor layer indicate relative directions with a surface on which a semiconductor device is provided deemed as an upper surface, and may differ from the upper and lower directions that are based on gravitational acceleration.

FIGS. 1 to 10 are cross-sectional views illustrating a method for manufacturing a semiconductor device 1 according to some embodiments. The semiconductor device 1 is, for example, a NAND-type electrically erasable programmable read-only memory (EEPROM), and is a three-dimensional memory in which memory cells are three-dimensionally arranged. In some embodiments, the semiconductor device 1 may be other than the NAND-type EEPROM and the three-dimensional memory.

In some embodiments, in order to form three-dimensionally arranged memory cells, a stacked body is formed by alternately stacking a sacrificial layer 20 and an interlayer insulating layer 30 one by one in layers on a semiconductor layer 10. The sacrificial layer 20 is made from, for example, a silicon nitride film. The interlayer insulating layer 30, which serves as a first insulating layer, is made from, for example, a silicon oxide film. In some embodiments, the sacrificial layer 20 and the interlayer insulating layer 30 are formed by using a chemical vapor deposition (CVD) method or an atomic layer deposition (ALD) method. In some embodiments, the number of stacked layers of each of the sacrificial layer 20 and the interlayer insulating layer 30 is not specifically limited.

Next, in some embodiments, an organic film 40 is formed above the stacked body. In some embodiments, the organic film 40 is processed as a film to be processed, and is then used as a mask material in processing the stacked body. The organic film 40 is, for example, a carbon film formed by using the CVD method.

Next, in some embodiments, a resist film 50 is applied above the organic film 40. In some embodiments, the resist film 50 is processed into a layout of memory holes by using a lithography technique. Thus, a structure illustrated in FIG. 1 is obtained.

Figure 2:
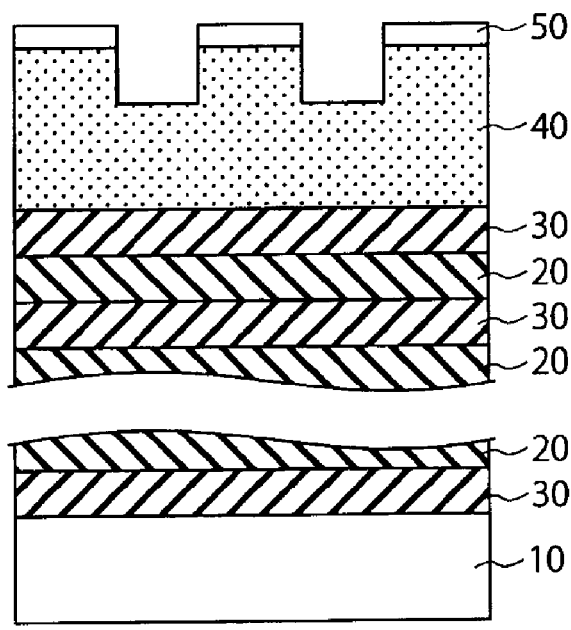
FIG. 2 is a cross-sectional view illustrating a method for manufacturing the semiconductor device, which may be performed after the method of FIG. 1.

Next, in some embodiments, an upper portion of the organic film 40 is processed according to a reactive ion etching (RIE) method using the resist film 50 as a first mask (as a first etching process). In some embodiments, as illustrated in FIG. 2, the upper portion of the organic film 40 (e.g., several tens percent of the film thickness of the organic film 40) is anisotropically processed into a layout pattern of memory holes. In some embodiments, the organic film 40 is etched partway (e.g., partway through a bottom surface of the organic film 40) using the resist film 50 as a mask. At this time, in some embodiments, an etching gas used for processing the upper portion of the organic film 40 can be either an oxidation gas or a reducing gas. The oxidation gas can include, for example, etching gas containing oxygen ($O_2$) or carbonyl sulfide (COS). The reducing gas can include, for example, a single gas of hydrogen ($H_2$) or ammonia ($NH_3$), or a mixed gas containing at least one of $H_2$ and $NH_3$.

Figure 3:
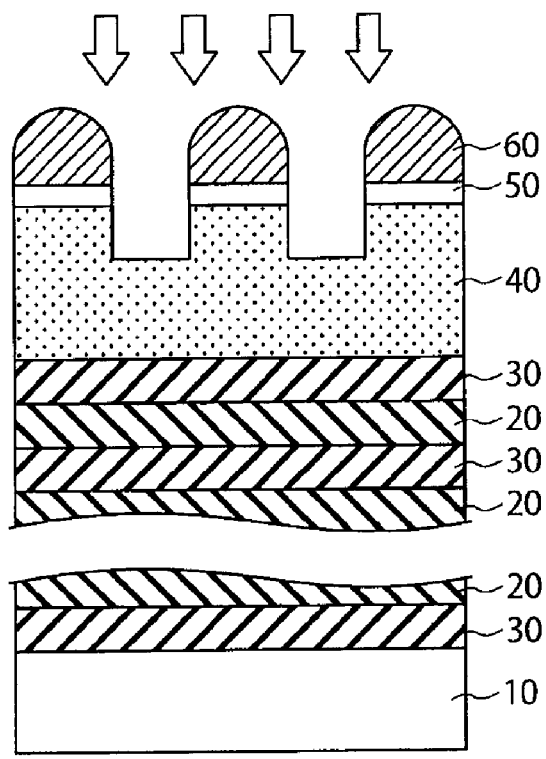
FIG. 3 is a cross-sectional view illustrating a method for manufacturing the semiconductor device, which may be performed after the method of FIG. 2.

Next, in some embodiments, tungsten or a tungsten compound 60 (see FIG. 3; hereinafter referred to as a "tungsten-containing film 60") is selectively formed on the resist film 50. The tungsten-containing film 60 is, for example, a film containing tungsten nitride (WN), tungsten carbide (WC), tungsten boride (WB), or tungsten silicide (WSi), a mixed film containing two or more of those compounds (e.g., WN, WC, WB or WSi), or an alloy film containing two or more of those compounds (e.g., WN, WC, WB or WSi). In some embodiments, an alloy film contains W and two or more different elements, such as selected from N, C, B, and Si. Thus, a structure illustrated in FIG. 3 is obtained.

In some embodiments, the upper portion of the organic film 40 is previously processed into a layout pattern of memory holes or a hole pattern, and the aspect ratio (e.g., depth to aperture width) of the hole pattern reaches a considerably large value (e.g., depth to aperture width is greater than 1:1). Accordingly, in some embodiments, although sputtering is performed from above the organic film 40 and the resist film 50, the tungsten-containing film 60 can be hardly formed at a bottom portion of the hole pattern of the organic film 40, so that the tungsten-containing film 60 can be selectively formed on the upper surface of the resist film 50. In some embodiments, the aspect ratio (e.g., depth to aperture width) of a hole pattern for selectively forming the tungsten-containing film 60 on the upper surface of the resist film 50 varies with a formation condition for the tungsten-containing film 60.

In some embodiments, the tungsten-containing film 60 is small in the degree of deformation caused by a collision in a direction of etching gas (or etching direction), as compared with a silicon oxide film. For example, a silicon oxide film is likely to be deformed when etching is performed from an oblique direction inclined from the direction perpendicular to the surface of the interlayer insulating layer 30. In contrast to this, the tungsten-containing film 60 is unlikely to be deformed even when etching is performed from the oblique direction. Accordingly, the tungsten-containing film 60 can prevent block of an aperture portion of the organic film 40 in forming a pattern of memory holes on the organic film 40.

Figure 4:
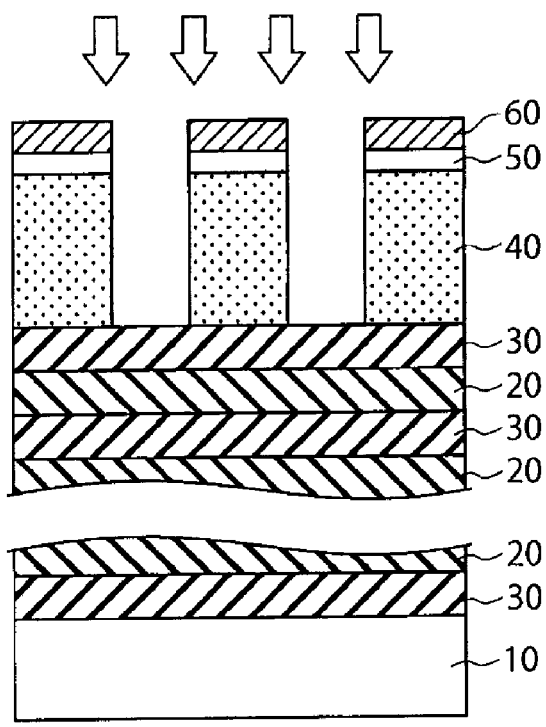
FIG. 4 is a cross-sectional view illustrating a method for manufacturing the semiconductor device, which may be performed after the method of FIG. 3.

Next, in some embodiments, a lower portion of the organic film 40 is processed with a reducing gas using the tungsten-containing film 60 as a second mask (as a second etching process). The reducing gas can include, for example, a single gas of hydrogen ($H_2$) or ammonia ($NH_3$), or a mixed gas containing at least one of $H_2$ and $NH_3$. Thus, a structure illustrated in FIG. 4 is obtained.

Here, if the lower portion of the organic film 40 is processed with an oxidation gas, the tungsten-containing film 60 may be oxidized. If the tungsten-containing film 60 is oxidized or sulfurated into a tungsten oxide film or a tungsten sulfide, the tungsten-containing film 60 may become weak in resistance to etching as with an oxide mask. In this case, the tungsten-containing film 60 would gradually deform and then block a pattern of memory holes of the organic film 40.

Therefore, in some embodiments, the organic film 40 is processed with a reducing gas. This can prevent oxidization of the tungsten-containing film 60 during the second etching process and prevent deformation of the tungsten-containing film 60. In some embodiments, preventing deformation of the tungsten-containing film 60 allows the tungsten-containing film 60 to prevent block of a pattern of memory holes of the organic film 40. As a result, an intended memory hole pattern can be formed on (or formed in) the organic film 40. In some embodiments, after an intended memory hole pattern is formed on (or formed in) the organic film 40, the resist film 50 and the tungsten-containing film 60 may be removed.

Figure 5:
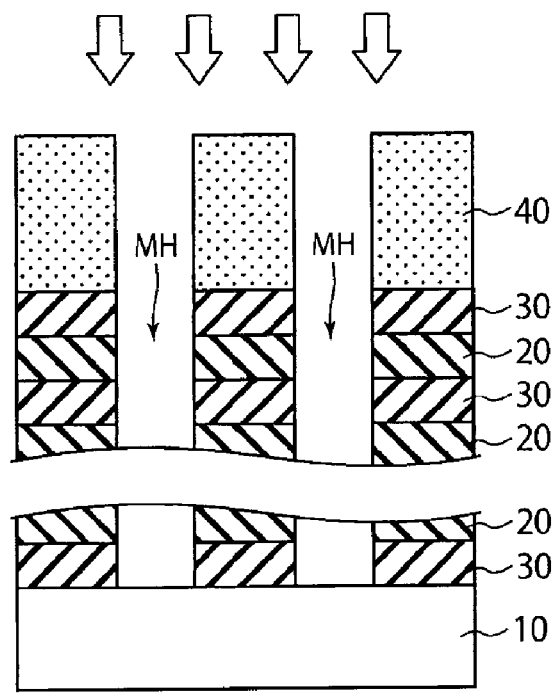
FIG. 5 is a cross-sectional view illustrating a method for manufacturing the semiconductor device, which may be performed after the method of FIG. 4.

Next, in some embodiments as illustrated in FIG. 5, the stacked body (e.g., the sacrificial layer 20 and the interlayer insulating layer 30) is processed using the organic film 40 as a mask. At this time, in some embodiments, either an oxidation gas or a reducing gas can be used as an etching gas. Thus, as illustrated in FIG. 5, in some embodiments, memory holes MH are formed in the stacked body. In some embodiments, the memory hole MH is formed so as to extend in the stacking direction of the stacked body and to extend from the upper surface of the interlayer insulating layer 30 serving as the uppermost layer of the stacked body to the semiconductor layer 10 (e.g., to an upper surface of the semiconductor layer 10). In some embodiments, side surfaces of the sacrificial layer 20 and the interlayer insulating layer 30 are exposed at the internal surface of the memory hole MH.

Figure 6:
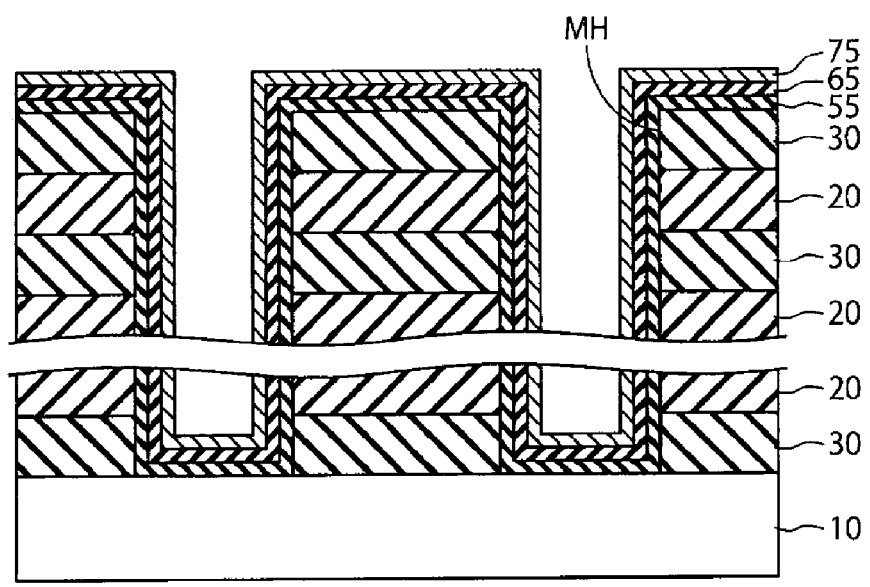
FIG. 6 is a cross-sectional view illustrating a method for manufacturing the semiconductor device, which may be performed after the method of FIG. 5.

Next, in some embodiments as illustrated in FIG. 6, a charge storage layer 55, a tunnel insulating layer 65, and a channel layer 75 on the inner surface of the memory hole MH are formed using the ALD method or the CVD method. The charge storage layer 55 is made from, for example, a silicon nitride film. The tunnel insulating layer 65 is made from, for example, a silicon oxide film. The channel layer 75 is made from, for example, amorphous silicon.

Next, in some embodiments, the channel layer 75, the tunnel insulating layer 65, and the charge storage layer 55 formed at the bottom portion of the memory hole MH may be removed using the lithography technique or the RIE method, so that the surface of the semiconductor layer 10 is exposed (not shown).

Figure 7:
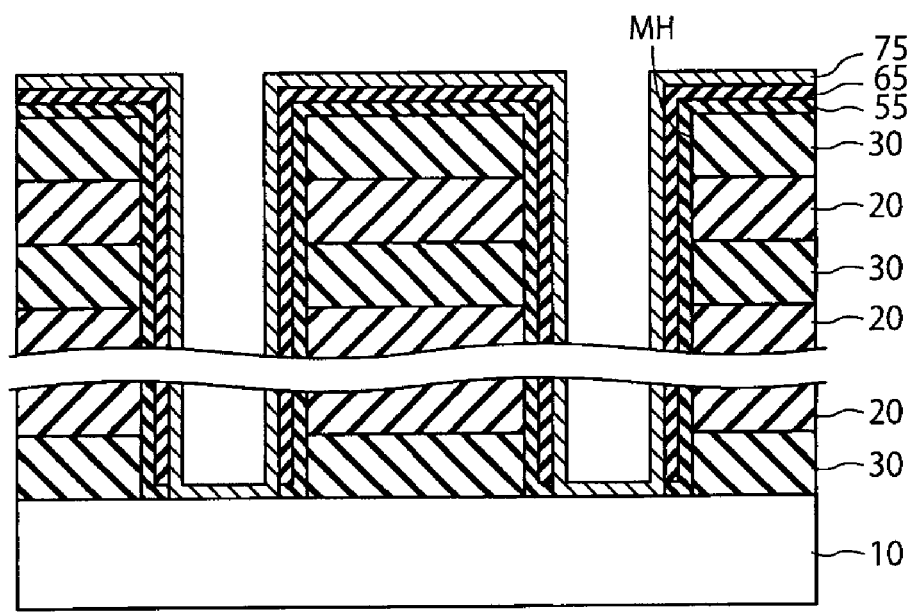
FIG. 7 is a cross-sectional view illustrating a method for manufacturing the semiconductor device, which may be performed after the method of FIG. 6.

Next, in some embodiments as illustrated in FIG. 7, the channel layer 75 on the inner surface of the memory hole MH is re-formed using the ALD method or the CVD method. In some embodiments, the channel layer 75 is electrically connected to the semiconductor layer 10 at the bottom portion of the memory hole MH, and is electrically connected up to the upper surface of the stacked body through the side surface of the memory hole MH. Thus, a structure illustrated in FIG. 7 is obtained.

Figure 8:
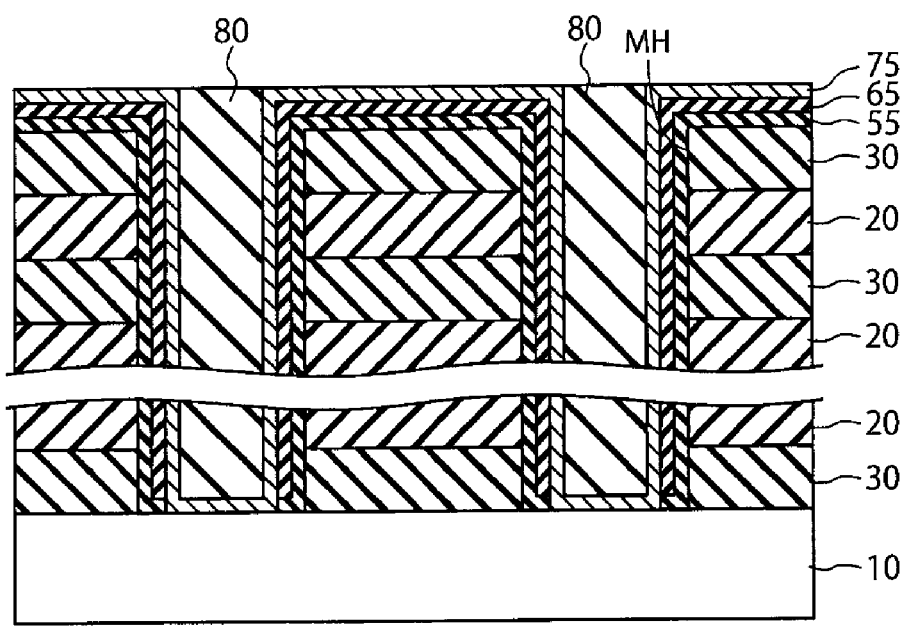
FIG. 8 is a cross-sectional view illustrating a method for manufacturing the semiconductor device, which may be performed after the method of FIG. 7.

Next, in some embodiments, a core insulating layer 80 inside the memory hole MH is formed using the ALD method or the CVD method, as illustrated in FIG. 8.

Figure 9:
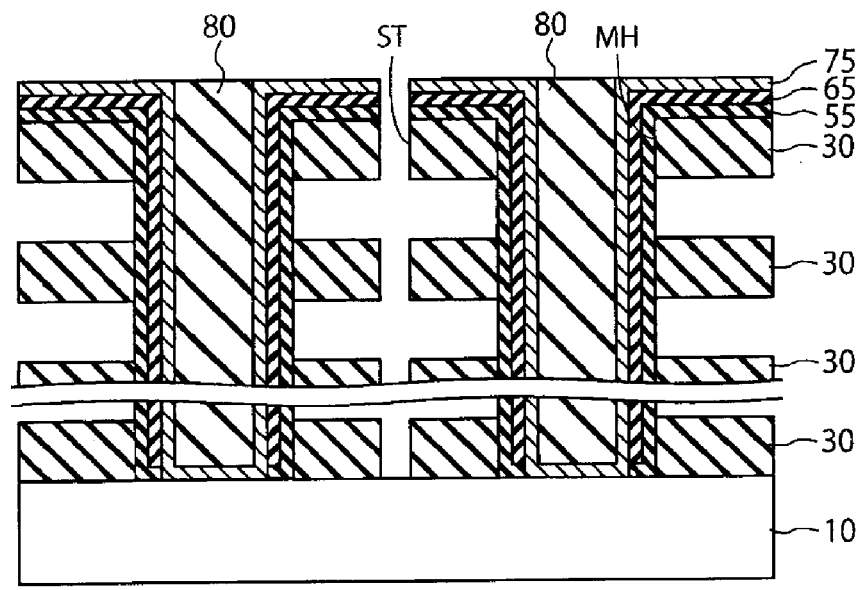
FIG. 9 is a cross-sectional view illustrating a method for manufacturing the semiconductor device, which may be performed after the method of FIG. 8.

Next, in some embodiments as illustrated in FIG. 9, a slit ST is formed in the stacked body of the sacrificial layer 20 and the interlayer insulating layer 30 using the RIE method and the sacrificial layer 20 is selectively removed using a wet etching method, as illustrated in FIG. 9.

Figure 10:
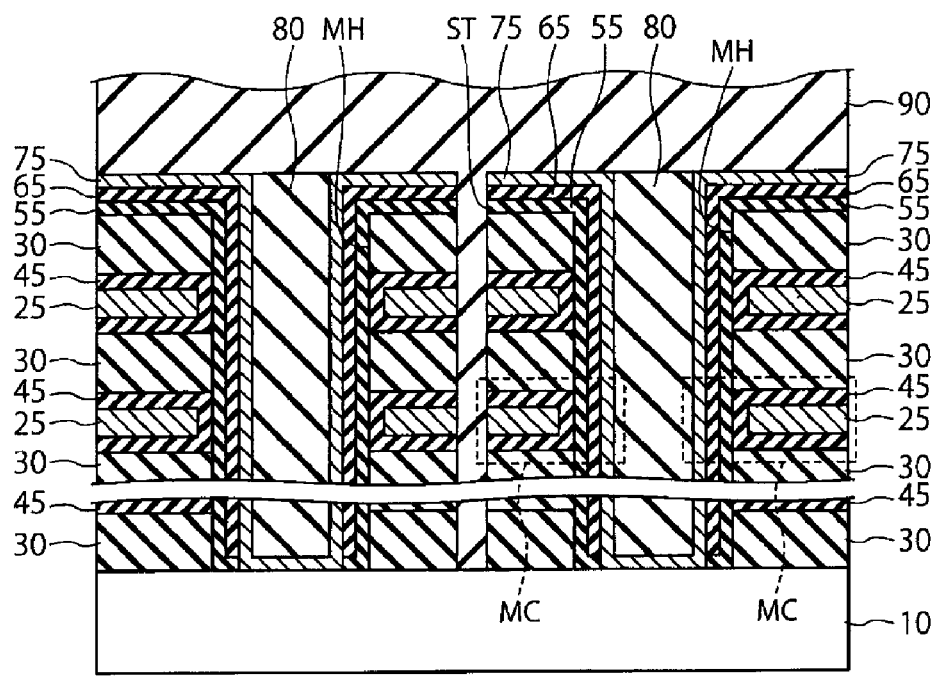
FIG. 10 is a cross-sectional view illustrating a method for manufacturing the semiconductor device, which may be performed after the method of FIG. 9.

Next, in some embodiments, a charge block layer 45 and an electrode layer 25 (which can form a memory cell (MC)) are formed at a portion obtained by removing the sacrificial layer 20 using the ALD method. After that, in some embodiments, an interlayer insulating film 90, contact plugs, interconnects, and so forth, are formed so that a memory according to some embodiments illustrated in FIG. 10 is completed.

In this way, according to some embodiments, when forming a pattern of memory holes on the organic film 40, an upper portion of the organic film 40 is processed using the resist film 50 as a first mask. After that, according to some embodiments, the tungsten-containing film 60 is selectively formed on the upper surface of the resist film 50. Then, according to some embodiments, a lower portion of the organic film 40 is processed with a reducing gas using the tungsten-containing film 60 as a second mask, so that the tungsten-containing film 60 is neither oxidized nor sulfurated and is thus less likely to be deformed during the second etching process. Accordingly, memory holes of the organic film 40 formed by the CVD method can be prevented from being blocked. As a result, an intended memory hole pattern can be formed on the organic film 40, and memory holes with a high aspect ratio can be formed in the stacked body of the sacrificial layer 20 and the interlayer insulating layer 30.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, the method comprising:
    forming a resist film above a film to be processed;
    processing an upper portion of the film to be processed using the resist film as a first mask;
    selectively forming tungsten or a tungsten compound on the resist film; and
    processing a lower portion of the film to be processed with a reducing gas using the tungsten or the tungsten compound as a second mask.

2. The method according to claim 1, wherein the film to be processed is an organic film formed by using a chemical vapor deposition (CVD) method.

3. The method according to claim 1, wherein the tungsten compound is (1) a film containing tungsten nitride (WN), tungsten carbide (WC), tungsten boride (WB), or tungsten silicide (WSi), (2) a mixed film containing two or more of WN, WC, WB, or WSi, or (3) an alloy film containing two or more of WN, WC, WB, or WSi.

4. The method according to claim 1, further comprising:
    forming a stacked body including a silicon oxide film and a silicon nitride film; and
    forming the film to be processed above the stacked body.

5. The method according to claim 1, further comprising, after processing the lower portion of the film to be processed using the second mask, processing the stacked body using the film to be processed as a mask.

6. The method according to claim 1, wherein the reducing gas used for processing the lower portion of the film to be processed using the second mask is a single gas of hydrogen ($H_2$) or ammonia ($NH_3$), or a mixed gas containing at least one of $H_2$ and $NH_3$.

7. A method for manufacturing a semiconductor device, the method comprising:
    forming a resist film above a film to be processed;
    forming a hole pattern in an upper portion of the film to be processed using the resist film as a first mask;
    selectively forming tungsten or a tungsten compound on the resist film; and
    etching a lower portion of the film to be processed in the hole pattern using the tungsten or the tungsten compound as a second mask.

8. The method according to claim 7, wherein the film to be processed is an organic film formed by using a chemical vapor deposition (CVD) method.

9. The method according to claim 7, wherein the tungsten compound is (1) a film containing tungsten nitride (WN), tungsten carbide (WC), tungsten boride (WB), or tungsten silicide (WSi), (2) a mixed film containing two or more of WN, WC, WB, or WSi, or (3) an alloy film containing two or more of WN, WC, WB, or WSi.

10. The method according to claim 7, further comprising:
    forming a stacked body including a silicon oxide film and a silicon nitride film; and
    forming the film to be processed above the stacked body.

11. The method according to claim 7, further comprising, after etching the lower portion of the film to be processed using the second mask, processing the stacked body using the film to be processed as a mask.

12. The method according to claim 7, wherein the lower portion of the film to be processed in the hole pattern is etched using a single gas of hydrogen ($H_2$) or ammonia ($NH_3$), or a mixed gas containing at least one of $H_2$ and $NH_3$.

* * * * *